(12) United States Patent
Del Barga et al.

(10) Patent No.: US 10,338,099 B2
(45) Date of Patent: Jul. 2, 2019

(54) LOW PROFILE EDGE CLAMP SOCKET

(71) Applicant: Intel Corporation, Santa Clara, CA (US)

(72) Inventors: Christopher Del Barga, Beaverton, OR (US); Joe Walczyk, Tigard, OR (US); Ronald Michael Kirby, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/626,986

(22) Filed: Jun. 19, 2017

(65) Prior Publication Data

US 2018/0364279 A1  Dec. 20, 2018

(51) Int. Cl.
*G01R 1/04* (2006.01)

(52) U.S. Cl.
CPC .................. *G01R 1/0408* (2013.01)

(58) Field of Classification Search
CPC ............ G01R 1/0466; G01R 1/0483; G01R 31/2866; G01R 1/0433; G01R 1/06744; G01R 1/07314; G01R 1/045; G01R 31/2808; G01R 1/0416; G01R 1/0458; G01R 1/07371; G01R 31/2817; G01R 31/286; G01R 1/04; G01R 1/06705; G01R 31/2863; G01R 31/2899; G01R 31/2896; H01R 12/714; H01R 13/2421; H01R 13/24; H01R 13/2407; H01R 13/2435; H01R 13/33; H01R 2201/20; H01R 13/193; H01R 12/73; H01R 13/46; H01R 33/76; H01R 13/6581
See application file for complete search history.

(56) References Cited

U.S. PATENT DOCUMENTS

| | | | | |
|---|---|---|---|---|
| 5,108,302 A * | 4/1992 | Pfaff | ................... | G01R 1/0433 439/266 |
| 5,364,284 A * | 11/1994 | Tohyama | ............. | H01R 13/193 439/266 |
| 5,470,247 A * | 11/1995 | Fuchigami | ........... | G01R 1/0433 439/264 |
| 6,741,089 B2 * | 5/2004 | Conroy | ................ | G01R 1/0466 324/750.06 |
| 6,989,681 B2 * | 1/2006 | Maekawa | ............ | G01R 1/0483 324/754.03 |
| 7,101,209 B2 * | 9/2006 | Yates | ................... | G01R 1/0466 324/756.02 |

* cited by examiner

*Primary Examiner* — Vinh P Nguyen

(74) *Attorney, Agent, or Firm* — Schwegman Lundberg & Woessner, P.A.

(57) ABSTRACT

A socket assembly for a microelectronic device can include a body and a plurality of arm. The body can include a central socket configured to receive a microelectronic device therein. The plurality of arms can each be adjacent to the central socket, where each of the plurality of arms can be rotatably coupled to the body and each of the plurality of arms can be translatable relative to the body to move between an open position and a closed position. The arms can retain a microelectronic device within the central socket when the arms are in the closed position.

16 Claims, 11 Drawing Sheets

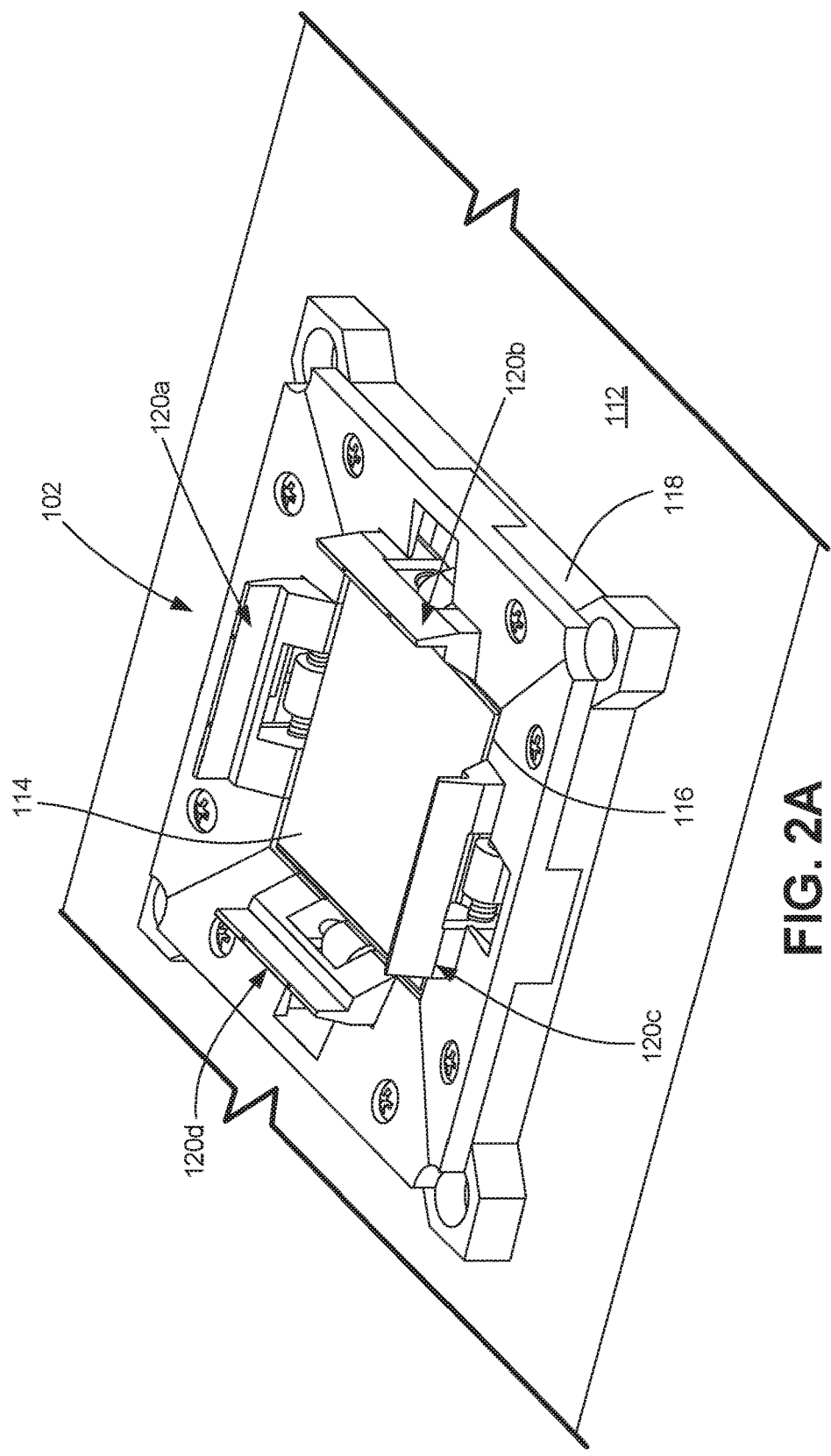

LOW PROFILE EDGE CLAMP SOCKET

TECHNICAL FIELD

Embodiments described herein generally relate to connections between microelectronic devices and microelectronic testing devices.

BACKGROUND

Microelectronic devices can include chips or integrated circuit devices, which can include processors such as central processing units (CPUs) or graphics processing units (GPUs) among others, for example. Often, microelectronic devices such as these must be tested for quality and/or for performance testing during, for example research and development of new or improved products. To test the microelectronic devices, a testing system can include a temporary connection between the microelectronic device and a tester or controller, where the tester can analyze performance of the microelectronic device.

BRIEF DESCRIPTION OF THE DRAWINGS

FIG. 2A illustrates an isometric view of a portion of a microelectronic testing system in a first condition, in accordance with at least one example of the present disclosure.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Some microelectronic and integrated circuit assemblies must be tested for quality and/or for performance testing. To test the microelectronic devices, a testing system can include a temporary connection between the microelectronic device and a tester or controller, where the tester can analyze performance of the microelectronic device. To decrease time and labor required to test a device, a selecting (or pick-and-place) arm can be used to select, place, and remove a device under test (DUT). To guide the DUT into place, lead-ins can be used to compensate for precision and accuracy tolerances of the selecting arm. An actuator or other clamping device can then be used to hold the DUT in place during testing.

However, the lead-ins and actuator can complicate testing. For example, lead-ins can interfere with wireless communication between a DUT and external sensors. The actuator contacting the DUT to hold it in place can also interfere with this communication.

The inventors have discovered, among other things, that movable lead-ins or arms can be powered by actuators disposed below the DUT and therefore do not interfere with wireless communication between the DUT and external sensors. Additionally, by incorporating moving arms or lead-ins, an access angle of the DUT can be increased, allowing for flexible placement of wireless sensors such as transmitters and/or receivers.

In one example, a socket assembly for a microelectronic device can include a body and a plurality of arm. The body can include a central socket configured to receive a microelectronic device therein. The plurality of arms can each be adjacent to the central socket, where each of the plurality of arms can be rotatably coupled to the body and each of the plurality of arms can be translatable relative to the body to move between an open position and a closed position. The arms can retain a microelectronic device within the central socket when the arms are in the closed position.

Figure 1:
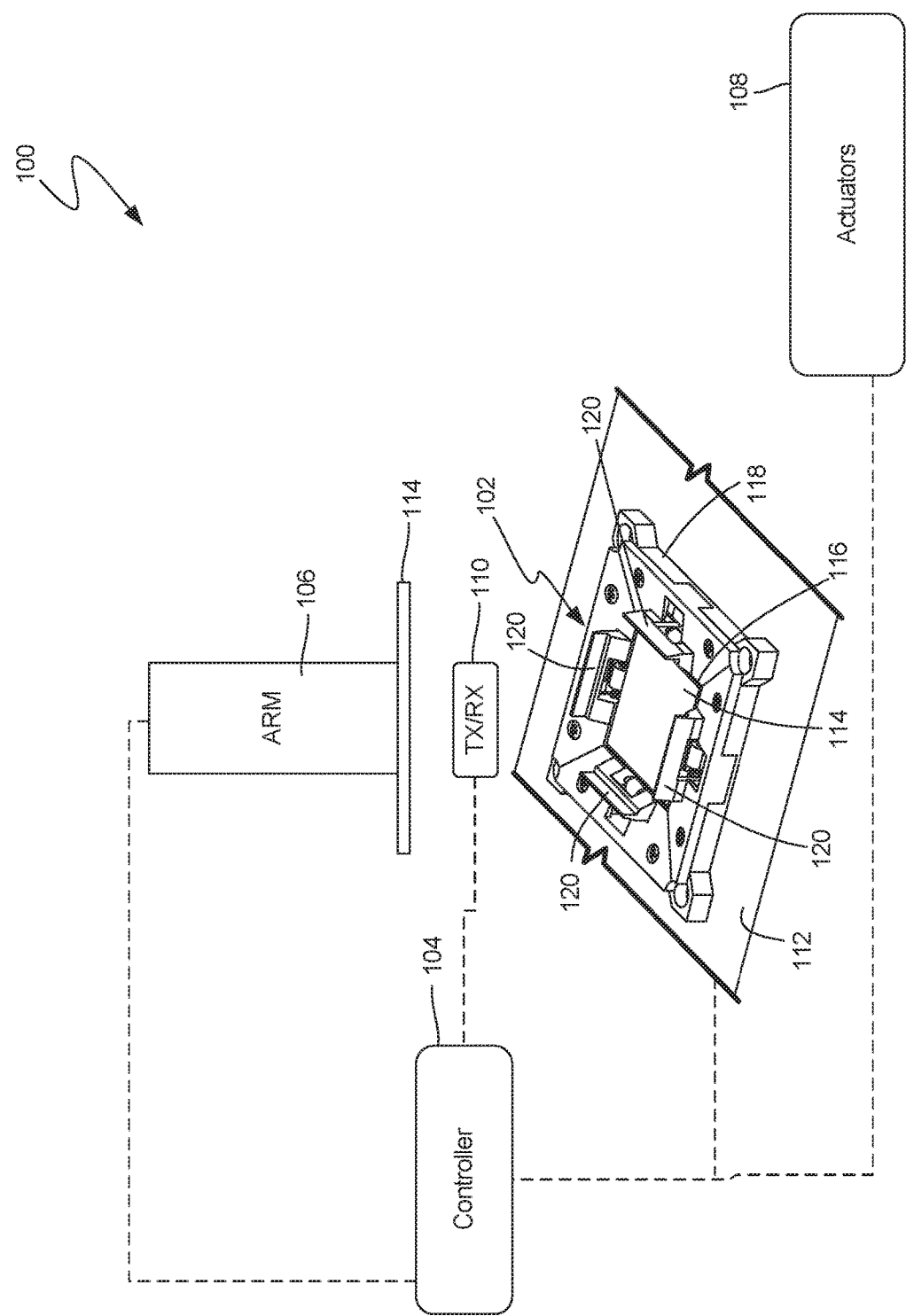
FIG. 1 illustrates a schematic view of a microelectronic testing system, in accordance with at least one example of the present disclosure.

FIG. 1 illustrates a schematic view of microelectronic testing system 100, in accordance with at least one example of the present disclosure. Microelectronic testing system 100 can include socket assembly 102, controller 104, selecting arm 106, actuators 108, transceiver 110, printed circuit board (PCB) 112, and device under test (DUT) 114. Socket assembly 102 can include central socket 116, body 118, and arms 120.

Microelectronic testing system 100 can be a system configured to test microelectronic devices, such as central processing units (CPUs), graphics processing units (GPUs), modems, other integrated packages (IPs), and the like. For example, the microelectronic devices can be tested for quality or tested for research and development. The components of microelectronic testing system 100 and their operations are described in further detail below.

Controller 104 can be any computing device, such as a handheld computer, for example, a smart phone, a tablet, a laptop, a desktop computer, or any other computing device including a processor and wired or wireless communication capabilities. In some examples, controller 104 can include a display and/or input device. For example, a user interface can be a monitor, keyboard, and mouse in one example. Controller 104 can include machine readable medium. The terms "machine readable medium" may include any medium that is capable of storing, encoding, or carrying instructions for execution by the device and that cause the device to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

Selecting arm 106 (or pick-and-place arm) can be a motorized arm in communication with controller 104. Selecting arm 106 can be configured to temporarily secure DUT 114 for placement of DUT 114 within socket assembly 102 or removal from socket assembly 102. In some examples, selecting arm 106 can be connected to three motors, an x-axis motor, a y-axis motor, and a z-axis motor, where each motor can be connected to controller 104. In some examples, a spindle motor can be connected to selecting arm 106 to rotate selecting arm 106 about a z-axis of selecting arm 106.

Actuators 108 can be linear actuators, each in communication with controller 104 and each physically coupled (directly or indirectly) to one of arms 120. In some examples, actuators 108 can be linear actuators and in some other examples, actuators 108 can be rotary motors.

Transceiver 110 can be a wireless transceiver configured to communicate via a wireless standard communication protocol such as WiFi (IEEE 802.11 standards), Bluetooth, extremely high frequency or EHF (MMW; 5G), or near field communication (NFC). In some examples, transceiver 110 can be only a receiver or a transmitter. Transceiver 110 can be positioned to communicate with DUT 114 when DUT 114 is disposed in central socket 116.

PCB 112 can be an integrated circuit board configured to mechanically support and electrically connect electrical components and supporting components. For example, PCB 112 can mechanically support socket assembly 102 and can be electrically connected to controller 104 and central socket 114 (and therefore DUT 114 when DUT 114 is coupled to central socket 114). DUT 114 can be a microelectronic device, such as a CPU, GPU, IP, and the like. DUT can be of standard socket size configured to engage central socket, as described in further detail below.

In some examples, system 100, and especially controller 104 and PCB 112 can comprise automated test equipment (ATE), which can include a variety of different instruments (digital, analog) that can be used for testing a device, such as DUT 114. In some examples, an ATE, such as can be included in system 100, can be used to quickly perform a test or tests on a component and can be further used to automatically analyze results of the test to determine and output a condition of the tested component.

Body 118 can be a rigid housing comprised of rigid materials such as plastics, metals, ceramics, composites, and combinations thereof. Central socket 116 can be formed in the center of body 118 and can be configured to receive DUT 114 to provide a temporary electrical interface between DUT 114 and PCB 112. Accordingly, central socket 116 can include pins to electrically connect to DUT 114 and can similarly connect to PCB 112.

Arms 120 can be rigid members coupled to body 118 and surrounding central socket 116. Arms 120 can be comprised of rigid materials such as plastics, metals, ceramics, composites, and combinations thereof. Arms 120 can be pivotable and translatable relative to body 120. Arms 120 can be in an open position as shown in FIG. 1 and can slide and rotate into a closed position, as shown in later FIGS. Arms 120 can be of a quantity of four in some examples, but can be of other quantities such as 1, 2, 3, 5, 6, 7, 8, 10, and the like.

In operation of some examples, arms 120 can be an open position, as shown in FIG. 1. Controller 104 can then send a signal to selecting arm 106 to move to a position of DUT 114 and select and retain DUT 114. Controller 104 can then direct arm 106 to place DUT in central socket 116. When arm 106 release DUT 114 over central socket 116, arms 120 act as lead-ins, guiding DUT 114 into a proper position within central socket 116.

Controller 104 can then direct arm 106 to move clear of socket assembly 102 and can direct actuators 108 to move toward a closing direction causing arms 120 to move to a closed position, retaining DUT 114 within central socket 116. Once DUT 114 is secured within central socket 116, a test can commence. Controller 104 can direct PCB 112 to perform electrical and/or functional tests on DUT 114, such as testing data transfer speeds, voltages, currents, circuit continuity, and the like. Further, controller 104 can enable transceiver 110 to send wireless signals to and/or receive wireless signals from DUT 114. Controller 104 can collect and stored data from testing for real-time analysis or analysis performed subsequent to the test.

In some prior art, an actuator is required to apply a force onto a top side of a DUT to hold the DUT into a socket. The present disclosure addresses this issue by integrating arms 120 into socket assembly 102. This allows actuators 108 to be connected to arms below socket assembly 102 (as shown in detail below), clearance above socket assembly 102 for mounting of a heat sink, for example. This clearance can also allow transceiver 110 to be mounted anywhere transceiver 110 can communicate with DUT 114, as opposed to in some prior art, where a transceiver must be placed to avoid interference with an actuator holding the DUT in place.

Further flexibility in placement of the transceiver is provided by the design of arms 120. Because arms 120 rotate inward (as shown in FIG. 2B below), socket assembly 102 provides a relatively large access angle allowing more flexibility Though microelectronic testing system 100 is described above as including selecting arm 106 for selection, placement, and removal of DUT 114, microelectronic testing system 100 can include no selecting arm and these function (selection, placement, and removal of DUT 114) can be performed manually by a human tester or operator.

Figure 2B:
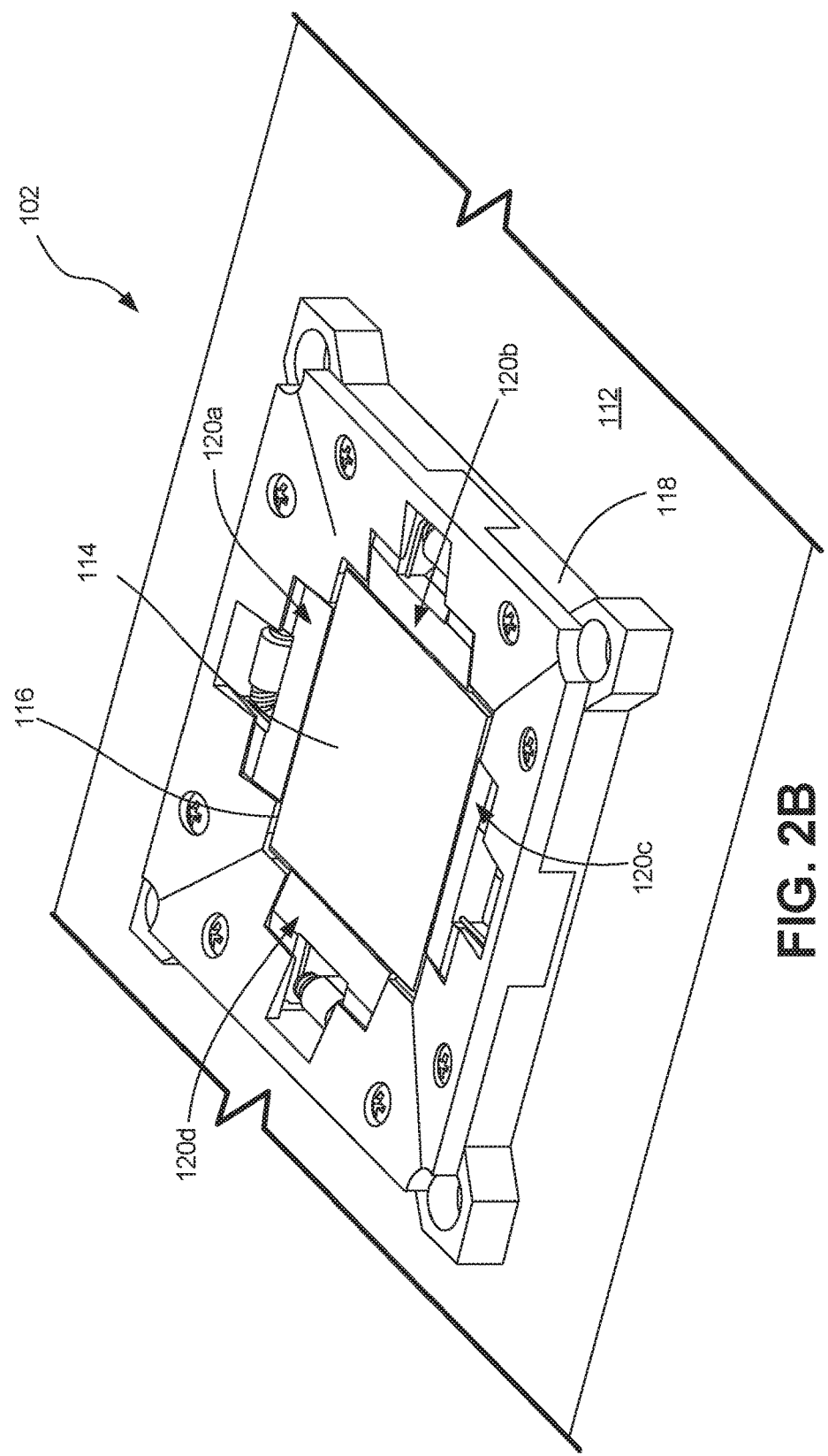
FIG. 2B illustrates an isometric view of a portion of a microelectronic testing system in a second condition, in accordance with at least one example of the present disclosure.

FIG. 2A illustrates an isometric view of a portion of microelectronic testing system 100 in a first condition, in accordance with at least one example of the present disclosure. FIG. 2B illustrates an isometric view of a portion of microelectronic testing system 100 in a second condition, in accordance with at least one example of the present disclosure. FIGS. 2A and 2B are discussed below concurrently.

Microelectronic testing system 100 can include socket assembly 102 and PCB 112. Socket assembly 102 can include central socket 116, body 118, and arms 120a, 120b, 120c, and 120d. Microelectronic testing system 100 of FIGS. 2A and 2B can be consistent with FIG. 1, except that FIGS. 2A and 2B show microelectronic testing system 100 in two conditions.

Each of arms 120a-120d can be a monolithic body that can include both a lead-in (chamfered) portion and a clamping portion and therefore each of arms 120a-120d can perform multiple functions. For example, FIG. 2A shows arms 120a-120d in an open position where arms 120a-120d can act as lead-ins for the placement of DUT 114, compensating for movement tolerance of selecting arm 106 (of FIG. 1). FIG. 2B shows arms 120a-120d in a closed and retracted position such that arms 120a-120d can act as clamps to retain DUT 114 within central socket 116. By retracting rams 120a-120d (as shown in FIG. 2B), an access angle can be increased (as discussed further below) and additional space is provided for heat sinks that may be temporarily coupled to DUT 114 to transfer heat from DUT 114 during testing.

Figure 3:
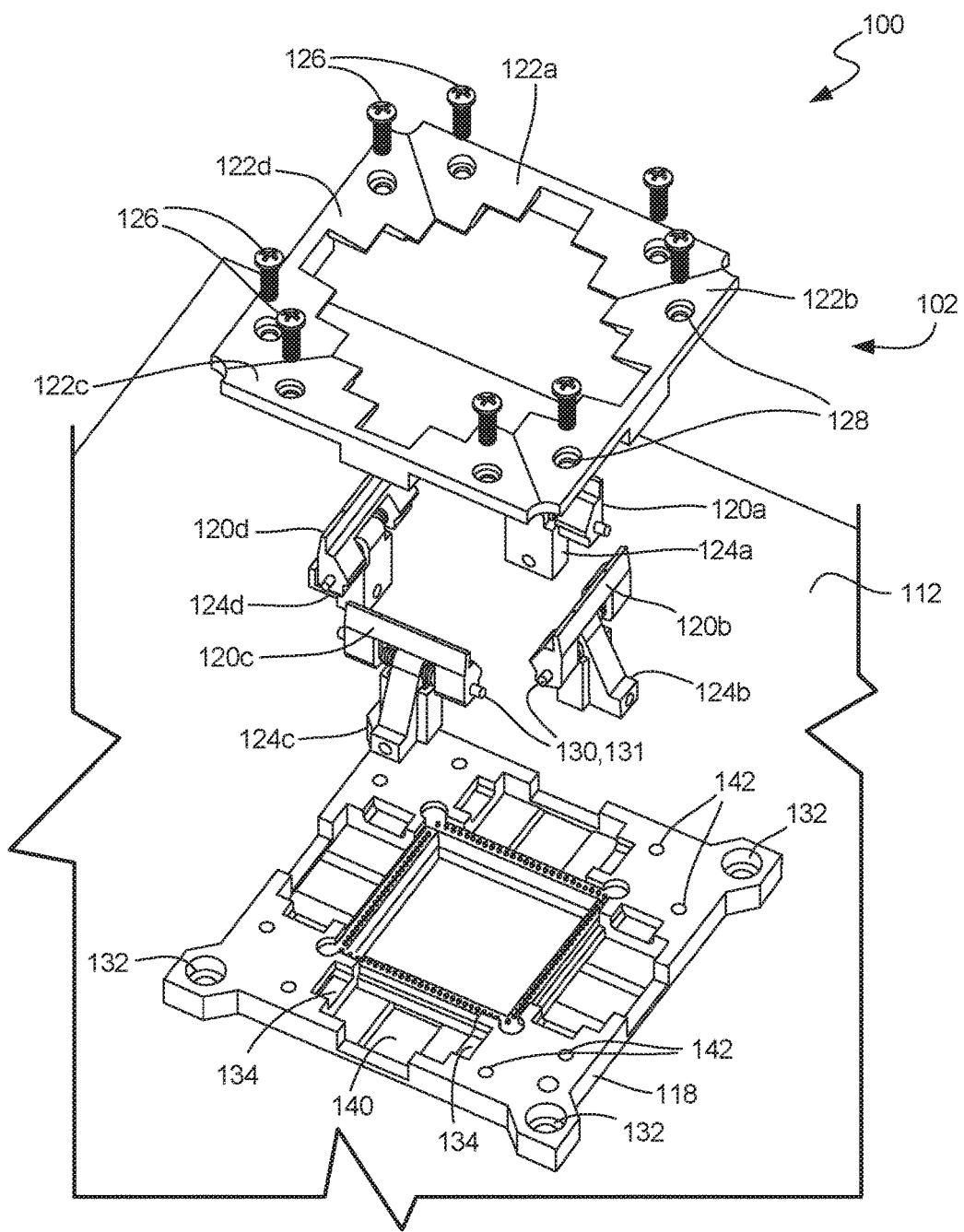
FIG. 3 illustrates an exploded view of a portion of a microelectronic testing system, in accordance with at least one example of the present disclosure.
Figure 4:
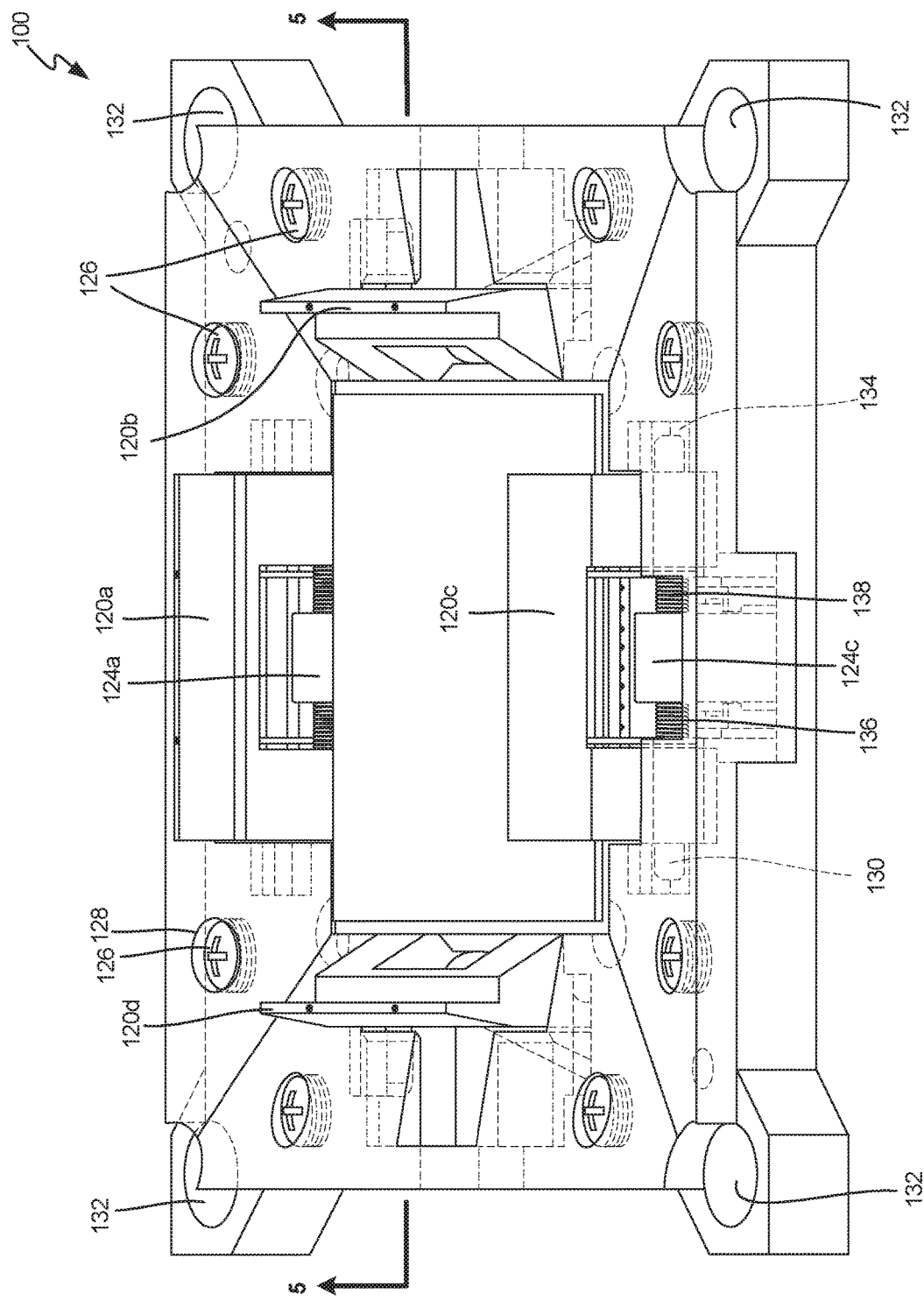
FIG. 4 illustrates a focused top isometric view of a portion of a microelectronic testing system, in accordance with at least one example of the present disclosure.

FIG. 3 illustrates an exploded view of a portion of microelectronic testing system 100, in accordance with at least one example of the present disclosure. FIG. 4 illustrates a focused top isometric view of a portion of microelectronic testing system 100, in accordance with at least one example of the present disclosure. FIGS. 3 and 4 are discussed concurrently below.

Microelectronic testing system 100 can include socket assembly 102, PCB 112, and DUT 114 (only shown in FIG. 4). Socket assembly 102 can include central socket 116, body 118, arms 120a, 120b, 120c, and 120d, retention plates 122a, 122b, 122c, and 122d, actuator links 124a, 124b, 124c, and 124d, fasteners 126, retention plate bores 128, pins 130, 131 (only two are labeled in FIG. 3 and only one is visible in FIG. 4), body bores 132, pin slots 134, and biasing elements 136 and 138 (only two visible in FIG. 4). PCB 112 can include PCB cuts 140. Body 118 can include body fastener bores 142.

Microelectronic testing system 100 of FIGS. 2A and 2B can be consistent with FIG. 1, except that FIGS. 2A and 2B show additional details of some components of microelectronic testing system 100. For example, FIG. 3 shows retention plates 122a-122d, which can be plates coupled to body 108 by fasteners, as described below. Retention plates 122a-122d can be comprised of rigid materials such as plastics, metals, ceramics, composites and the like. Retention plates 122a-122d can include notches or cutouts to receive arms 120a-120d and actuator links 124a-124d, where the notches can be sized to allow for movement of arms 120a-120d and actuator links 124a-124d therein.

Actuator links 124a-124d can be rigid members comprised of materials such as plastics, metals, ceramics, composites, and combinations thereof. Each of actuator links 124a-124d can be coupled to a respective one of arms 120a-120d via a pin. For example, arm 120c can be coupled to actuator link 124c via pin 130. Actuator links 124a-124d can be coupled at an opposite end to actuators, such as actuators 108 of FIG. 1.

Fasteners 126 can be screws, bolts, rivets, and the like, configured to secure to members. Retention plate bores 128 can be configured to receive fasteners 126 therethrough. Similarly, body fastener bores 142 can be configured to receive and retain fasteners 126, such that fasteners 126 can secure retention plates 122a-122d to body 108. Body bores 132 can be configured to receive a fastener therethrough to mechanically couple body 108 to PCB 112.

Pins 130 and 131 can be cylindrical pins comprised of rigid and smooth materials, such as metals, plastics, and combinations thereof. Pins 130 and 131 can be of geometric shapes such as cylinders, and the like, allowing pins 130 and 131 to act as a journal bearing interface between arms 120a-120d and actuator links 124a-124d, respectively. Pins 130 and 131 can also have a surface sufficiently smooth such that pins 130 and 131 can translate within pin slots 134 of body 108, where pins slots 134 are sized to allow translation of pins 130 and 131 to enable translation and rotation of arms 120a-120d, as described above and below.

Biasing elements 136 and 138 can be biasing elements, such as springs coupled, surrounding and coupled to pins 130 and 131 and engaging body 108 and each of arms 120a-120d. Each arm can be coupled to two biasing elements, such as is shown with respect to arm 120c and biasing elements 136 and 136. However, in other examples, each arm can be coupled to fewer or more biasing elements, such as 1, 3, 4, 5, 6, and the like. Biasing elements 136 and 138 can be torsion springs in some examples, but can be other types of springs, such as compression springs, in other examples.

PCB cuts 140 can be cutouts or holes in PCB 112 configured to receive actuator links 124a-124d therethrough. PCB cuts 140 can be sized to allow actuator links 124a-124d move relative to PCB 112 during opening and closing of arms 120a-120d.

Operation of the components described above are discussed with respect to the FIGS. below.

Figure 5A:
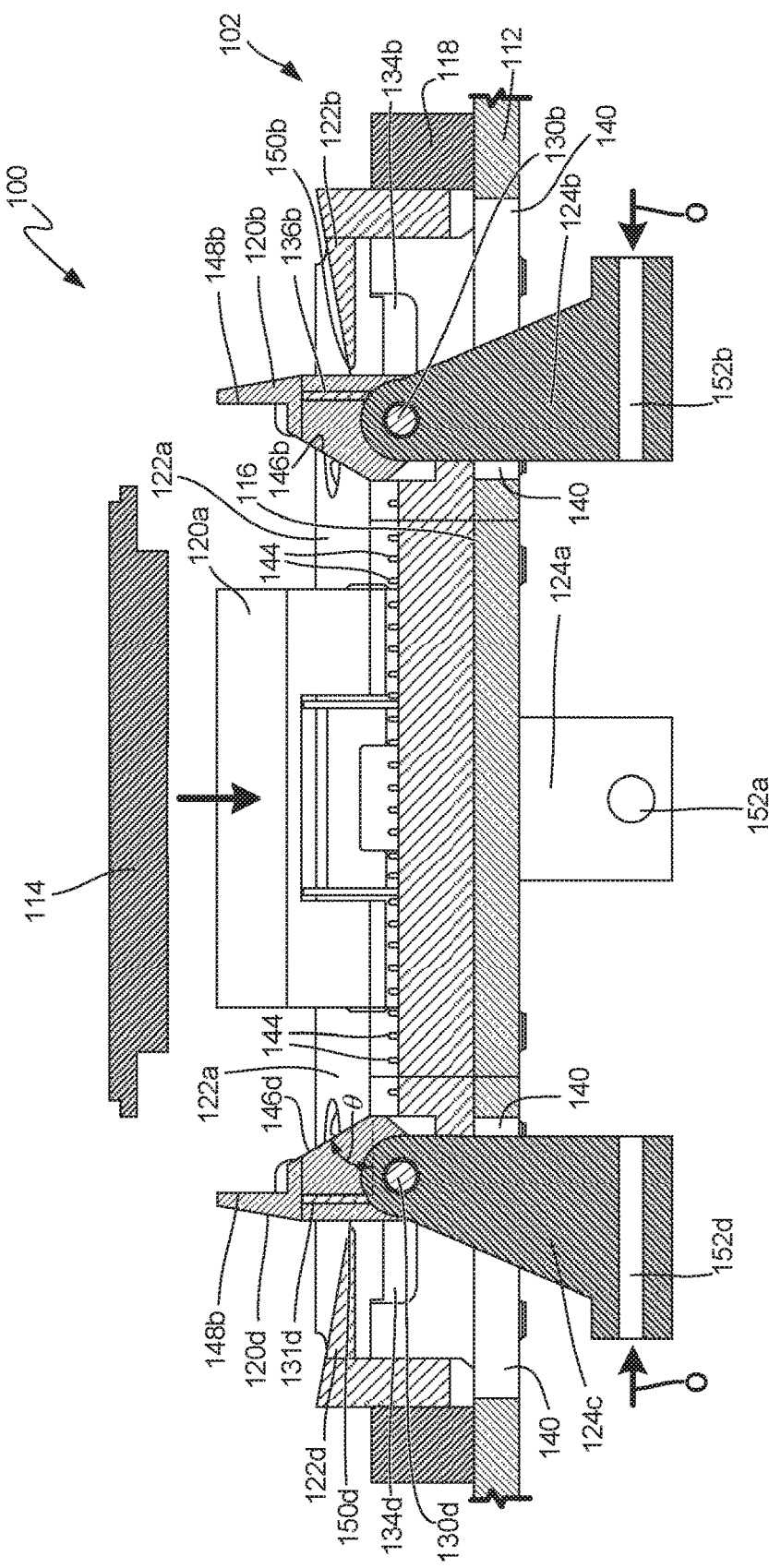
FIG. 5A illustrates an elevation cross-sectional view across arrows 5-5 of FIG. 4 of a portion of a microelectronic testing system in a first condition, in accordance with at least one example of the present disclosure.
Figure 5B:
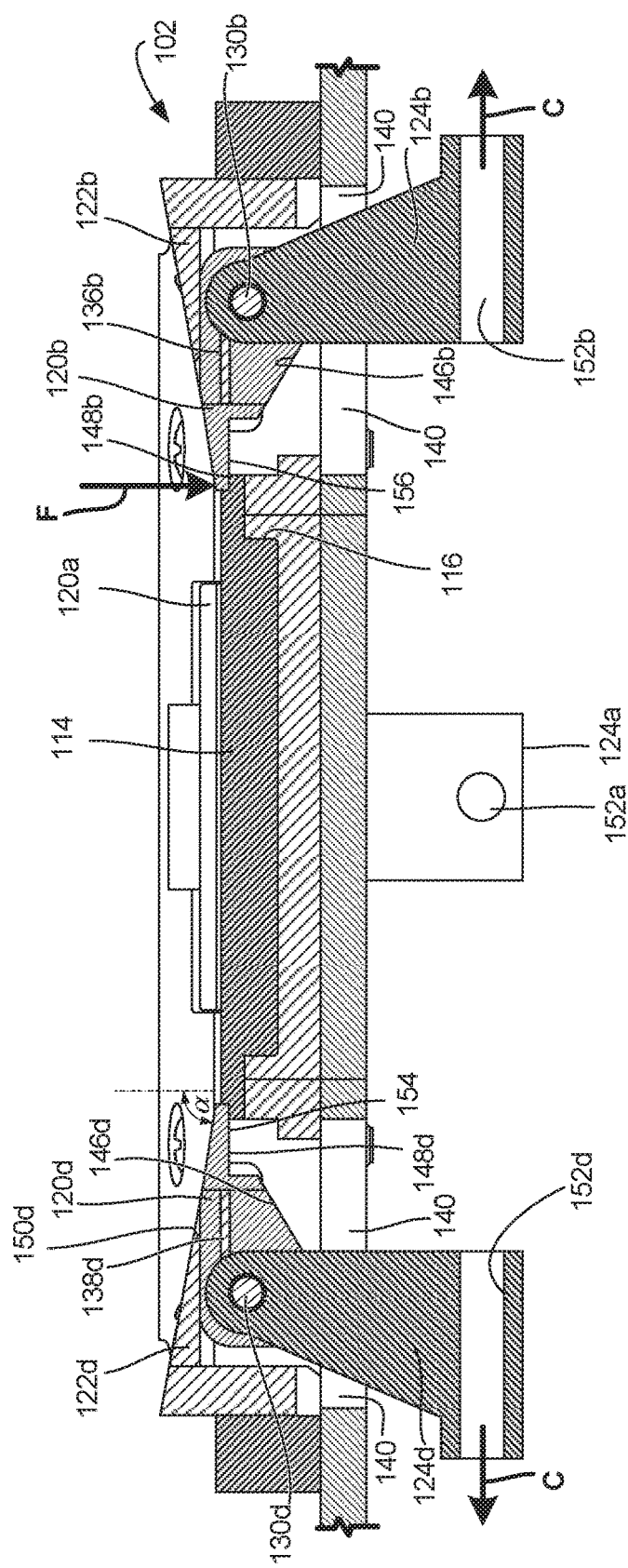
FIG. 5B illustrates an elevation cross-sectional view across arrows 5-5 of FIG. 4 of a portion of a microelectronic testing system in a second condition, in accordance with at least one example of the present disclosure.

FIG. 5A illustrates an elevation cross-sectional view across arrows 5-5 of FIG. 4 of a portion of microelectronic testing system 100 in a first condition, in accordance with at least one example of the present disclosure. FIG. 5B illustrates an elevation cross-sectional view across arrows 5-5 of FIG. 4 of a portion of microelectronic testing system 100 in a second condition, in accordance with at least one example of the present disclosure. FIGS. 5A and 5B are discussed below concurrently.

Microelectronic testing system 100 can include socket assembly 102, PCB 112, and DUT 114 (only shown in FIG. 4). Socket assembly 102 can include central socket 116, body 118, arms 120a, 120b, 120c, and 120d (arm 120d not shown), retention plates 122a, 122b, 122c, and 122d (retention plate 122d not shown), actuator links 124a, 124b, 124c, and 124d (not shown), pins 130b and 130d (only two shown in FIGS. 5A and 5B), pin slots 134b and 134d, and biasing elements 136b and 138d (only two visible in FIGS. 5A and 5B). Central socket 116 can include socket pins 144. Arms 120a-120d can include chamfers 146a-146d, respectively (only chamfers 146b and 146d visible in FIGS. 5A and 5B) and notches 148a-148d (only notches 148a-148d visible in FIGS. 5A and 5B). Retention plates 122a-122d can include distal terminations 150a-150d (only distal terminations 150b and 150d visible in FIGS. 5A and 5B). Actuator links 124a-124d can include actuator bores 152a-152d (152c not shown in FIGS. 5A and 5B). Body 108 can also include stops 154 and 156. Also shown in FIGS. 5A and 5B are angles α and θ.

Pin slots 134b and 134d can be configured to retain pins 130b and 130d, respectively, and can be configured to allow pins 130b and 130d to rotate and translate within pin slots 134b and 134d, respectively. Central socket 116 can include socket pins 144, which can be comprised of conductive metals such as gold, silver, platinum, aluminum, and the like. Socket pins 144 can be configured to electrically couple to DUT 114 and PCB 112.

Chamfers 146a-146d of can be angular cuts in a face of arms 120a and 120d, respectively. Chamfers 146a-146d can be cut at an angle to provide a lead-in for DUT as DUT is placed into central socket 116. In some examples, chamfers 146a-146d can form angle θ of approximately 60 degrees. This can provide a lead-in angle of about 120 degrees. In some other examples, angle θ can be of other angles, such as 20 to 90 degrees, such as 70 degrees, for example.

Notches 148a-148d can be notches or undercuts of a distal portion (away from a connection to pins 130a-130d) of arms 120a-120d, respectively. In some examples, notches 148a-148d can be sized to engage stops 154 and 156 when arms 120a-120d are in the closed position, preventing over rotation of arms 120a-120d. In some examples, notches 148a-148d can also be sized to engage DUT 114 when arms 120a-120d, applying a clamping force (F) to DUT 114 when arms 120a-120d are in the closed position. Stops 154 and 156 can also prevent application of excessive force to DUT 114 when arms 120a-120d are in the closed position.

Distal terminations 150a-150d can be a distal portion of cover plates 122a-122d, respectively. In some examples, distal terminations 150a-150d can be sized to engage arms 120a-120d, respectively, when arms 120a-120d are in an open position, limiting rotating of arms 120a-120d past an open position and controlling angle θ. In some examples, cover plates 122a-122d can be removable allowing for installation of cover plates having a distal termination at of a different length, allowing for angle θ to be changed, as desired.

Actuator bores 152a-152d of actuator links 124a-124d can be sized to couple to actuators 118 of FIG. 1. In some examples, actuator bores 152a-152d can be threaded and can be smooth in other examples.

In operation of some examples, arms 120a-120d can be in the open position as shown in FIG. 5A, driven open by a force in direction O applied by actuators 108 of FIG. 1. In some examples, the force in direction O can be continuously applied to hold arms 120a-120d in an open position. In other examples, the force in direction O can be removed as biasing elements 136 and 138 can hold arms 120a-120d in the open position. DUT 114 can be guided by a selecting arm, such as selecting arm 106 of FIG. 1) into central socket 116 of socket assembly 102. In this process arms 120a-120d can function as lead-ins, helping to guide DUT 120 into central socket 114 to engage pins 144 properly.

Once DUT 114 has been placed into central socket 116 (which can be detected by PCB 112 and controller 104 of FIG. 1), controller 104 can send a signal to actuate actuators 108. Actuators 108 can drive actuator links 124a-124b to translate in the direction C by applying force in the same direction, as described further in FIG. 6 below. Once arms 120a-120d have fully rotated, notches 148a-148d can contact DUT 114 and stops 154 and 156 to prevent over-rotation of arms 120a-120d while applying a clamping force (F) to DUT 114 to hold DUT 114 within central socket 116 until the force in direction C is removed from actuator links 124a-124d by actuators 108.

While arms 120a-120d are in the closed position, each can form angle α (also called an access angle) between a top portion of each of arms 120a-120d and an axis perpendicular to an outer face of DUT 114 (as shown in FIG. 5B). In some examples, angle α can be 80 degrees, but can be of other access angles in other examples. In some examples, angle α can be greater than 80 degrees, such as between 80 and 90 degrees. An access angle α of 80 degrees can allow for flexible placement of a transceiver 110 of FIG. 1 and can reduce interference in communication between transceiver 110 and DUT 114. An access angle α of 80 degrees can also provide mechanical access to probe a top or exposed portion of DUT 114 when DUT 114 is disposed in central socket 116. Placement of actuator links 124a-124d and therefore actuators 108 below DUT 114 and PCB 112 can further increase flexibility of placement of transceiver 110 and can further reduce interference between transceiver 110 and DUT 114.

Though four of actuator links are shown (124a-124d), other examples can include one actuator to drive a linkage and all actuators links together. In other examples, actuator links 124a-124d can be operated independently. In some other examples, actuator links 124a-124d can be eliminated and rotating motors can directly or indirectly drive pins 130a-130d.

Figure 6:
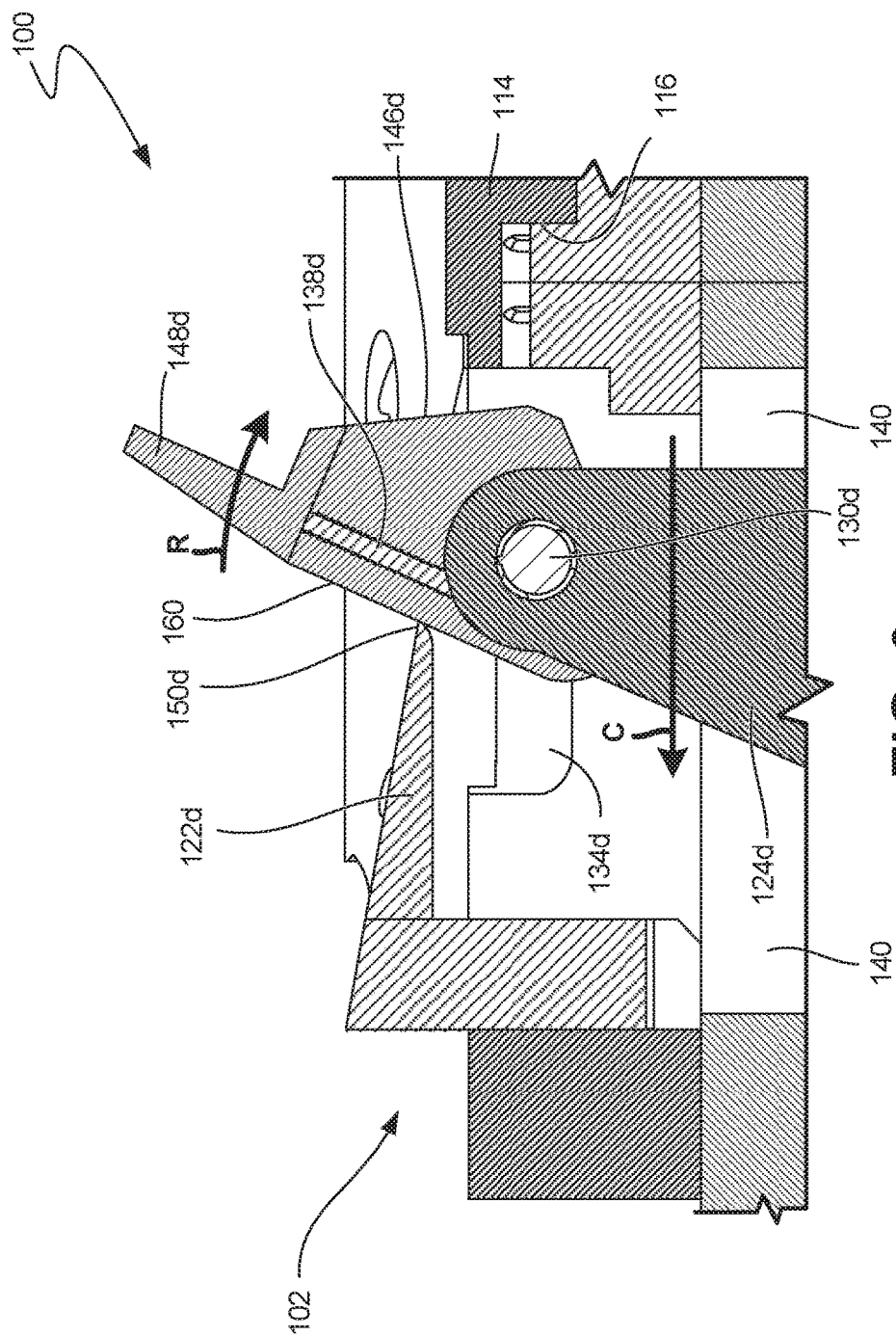
FIG. 6 illustrates a focused elevation view of a portion of a microelectronic testing system, in accordance with at least one example of the present disclosure.

FIG. 6 illustrates a focused elevation view of a portion of microelectronic testing system 100, in accordance with at least one example of the present disclosure. FIG. 6 shows rotational direction R.

Testing system 100 of FIG. 6 can be consistent with the description of testing system 100 in the FIGS. discussed above, however, FIG. 6 shows testing system in the process of closing. As shown in FIG. 6 when a linear force is applied in direction C, actuator link 124 can cause pin 130d to translate within pin slot 134d. This, in turn, causes arm 120d to translate in direction C, creating impact between distal termination 150d and side 160 of arm 120d, causing arm 120d rotate in direction R. As a force is continually applied in direction C, termination 150d can continue causing arm 120d to rotate in direction R until notch 120 engages DUT 114 and stop 154 (as shown in FIG. 5B), where stop 154 can prevent over-clamping when arm 120d is fully actuated.

By providing arms 120a-120d with the ability to rotate and translate as they close to secure DUT 114, arm 120a-120d can function as lead-ins in the open position of arms 120a-120d while providing a large access angle α (as shown in FIG. 5B) when arms 120a-120d are in the closed position.

Figure 7:
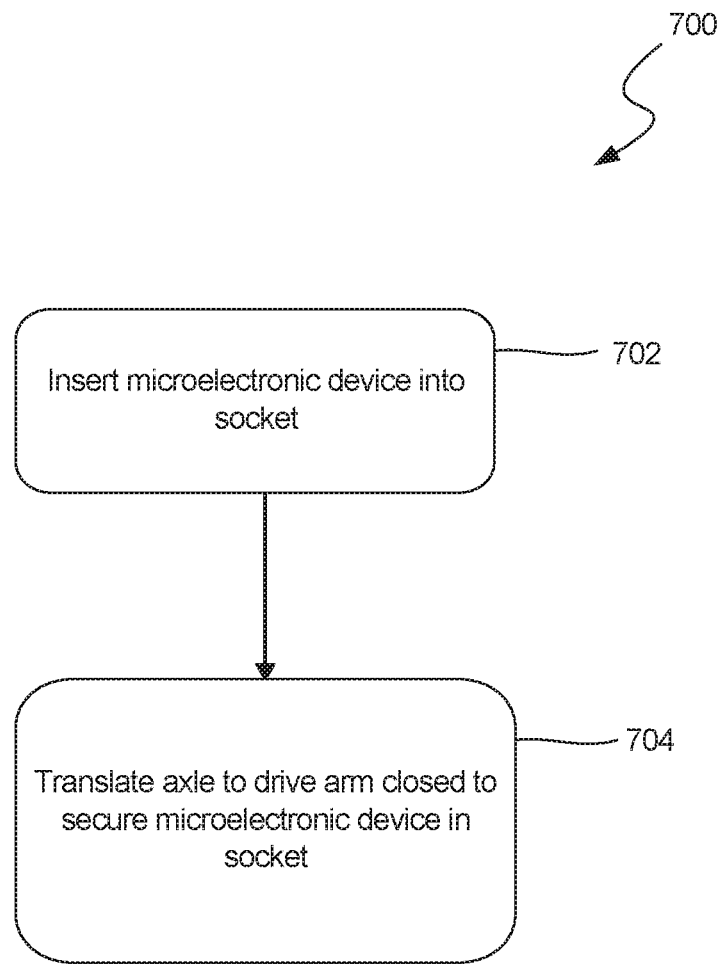
FIG. 7 illustrates a schematic view of a method, in accordance with at least one example of the present disclosure.

FIG. 7 illustrates a flow chart of method 700, a method of communicating between chips, in accordance with at least one example of the present disclosure. The operations of method 700 are illustrated in a particular order for convenience and clarity. Many of the discussed operations can be performed in a different sequence or in parallel without materially impacting other operations. Method 700, as discussed, includes operations performed by multiple different actors, devices, and/or systems. It is understood that subsets of the operations discussed in method 700 attributable to a single actor, device, or system could be considered a separate standalone process or method.

The methods discussed below can includes steps to select, place, and secure a microelectronic device in a testing system. The methods can also include steps of performance testing when the microelectronic device is electrically connected to the testing system and secured thereto. After testing is complete, the testing system can be operated to remove the microelectronic device from the testing system and the process can be repeated, as desired.

Method 700 can begin at operation 702, where a microelectronic device such as DUT 114 can be inserted into a socket, such as central socket 116. In some examples, during step 702, chamfers 146 of the arm(s) 120 can guide DUT 114 into position in central socket 116. Then, at step 704 axle 130 can be translated in a closing direction, which can cause one of arms 120a-120d to impact one of guide plates 122, causing rotation of arm towards a closed position, allowing the arm to secure the microelectronic device within the socket when the arm is in the closed position.

Figure 8:
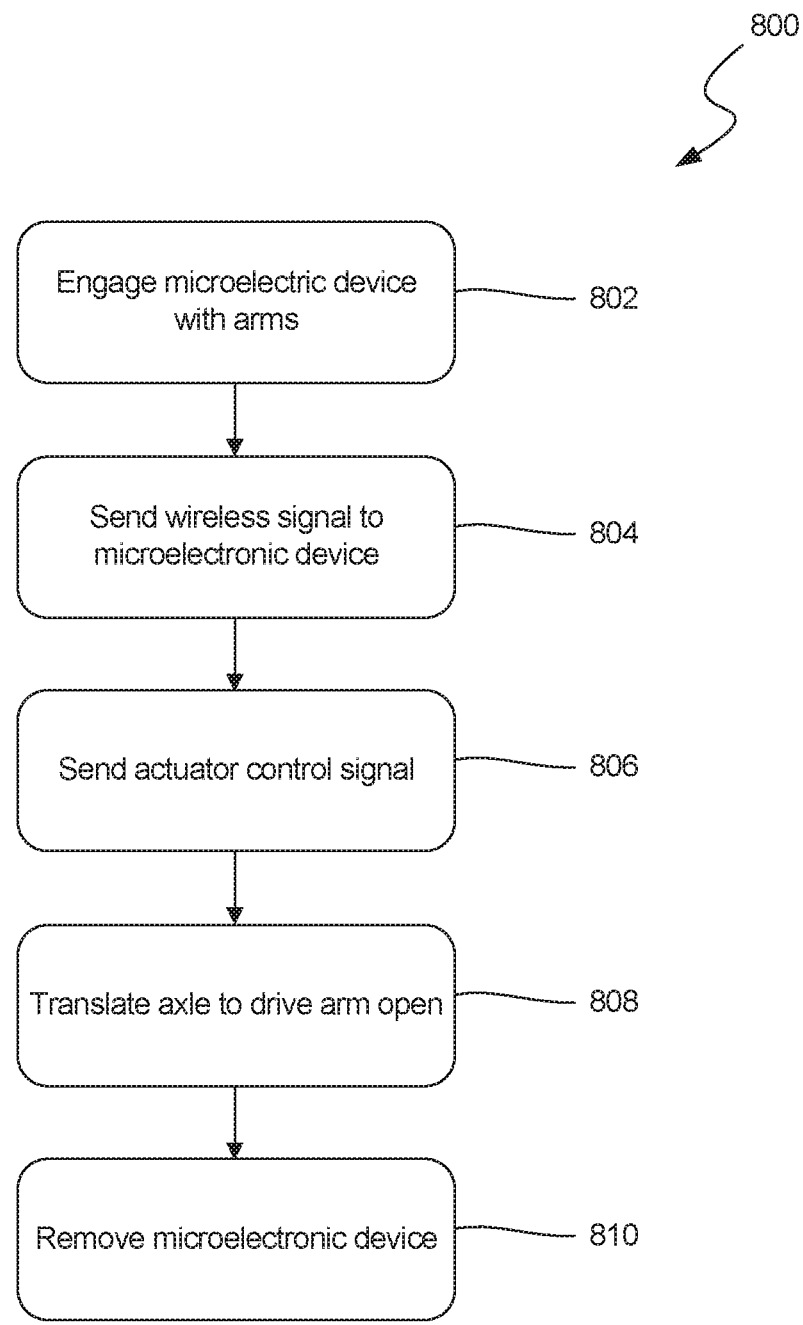
FIG. 8 illustrates a schematic view of a method, in accordance with at least one example of the present disclosure.

FIG. 8 illustrates a flow chart of method 800 in accordance with at least one example of the present disclosure. The operations or operations of method 800 are illustrated in a particular order for convenience and clarity. Many of the discussed operations can be performed in a different sequence or in parallel without materially impacting other operations. Method 800, as discussed, includes operations performed by multiple different actors, devices, and/or systems. It is understood that subsets of the operations discussed in method 800 attributable to a single actor, device, or system could be considered a separate standalone process or method.

In operation of some example, method 700 can be continued with method 800. For example, method 800 can continue from method 700 at operation 802, the arms can engage the microelectronic device. Once the microelectronic device is secured within the socket, testing can be performed by controller 104 and PCB 112 on the microelectronic device. Testing can include electronic, wireless, thermal, and other performance testing, in some examples. For example, controller 104 can send signals to and receive signals from DUT 114 through PCB 112. Controller 104 can also communicate wirelessly with DUT 114.

At step 804 a wireless signal can be sent from transceiver 110 to the microelectronic device while the arm is in the closed position and similarly the microelectronic device can send signals to transceiver 110. At step 806, controller 104 can send an actuator control signal a linear actuator, such as actuators 108, to translate actuator links 124 and operate axles 130 between the opening and closing directions. At step 808, the axle can be translated and rotated to drive an arm of arms 120 to an open position. Once arms 120 are open, the microelectronic device can be removed from the central socket, in some examples by selecting arm 106, at step 801.

Figure 9:
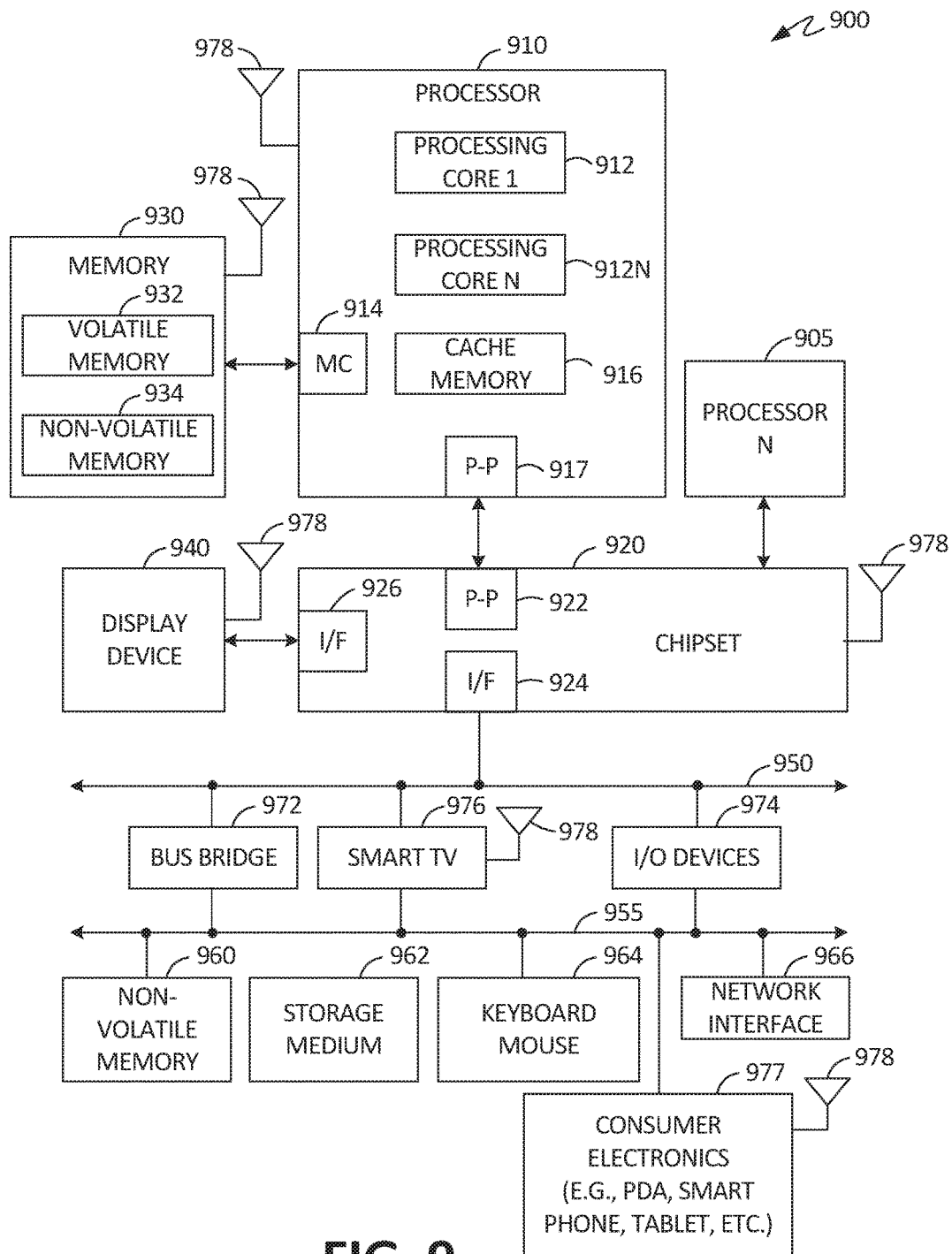
FIG. 9 illustrates a system level diagram, in accordance with at least one example of the present disclosure.

FIG. 9 illustrates a system level diagram, according to one example of the disclosure. For instance, FIG. 9 depicts an example of an electronic device (e.g., system) examples and methods described in embodiments above, such as those of microelectronic testing system 100, DUT 114, and other associated methods. FIG. 9 is included to show an example of a higher level device application for the present disclosure. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processing cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 802.11 standard and its related family, Home Plug AV (HPAV), Ultra Wide Band (UWB). Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the disclosure, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices 972, 976, 974, 960, 962, 964, 966, 977, etc. Chipset 920 may also be coupled to a wireless antenna 678 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the disclosure, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920 couples with a non-volatile memory 960, a mass storage device(s) 962, a keyboard/mouse 964, and a network interface 966 via interface 924 and/or 904, smart TV 976, consumer electronics 977, etc.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV). Ultra Wide Band (UWB). Bluetooth. WiMax. or any form of wireless communication protocol.

While the modules shown in FIG. 6 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

FURTHER NOTES AND EXAMPLES

To better illustrate the methods and apparatuses described herein, a non-limiting set of example embodiments are set forth below as numerically identified examples:

Example 1 is a socket assembly for a microelectronic device comprising: a body comprising a central socket configured to receive a microelectronic device therein; a plurality of arms each adjacent to the central socket, each of the plurality of arms rotatably coupled to the body and each of the plurality of arms translatable relative to the body to move between an open position and a closed position, the arms retaining a microelectronic device within the central socket when the arms are in the closed position.

In Example 2, the subject matter of Example 1 optionally includes the body further comprising: a plurality of axles coupled to the body, each of the plurality of axles coupled to one of the plurality of arms such that each arm is rotatable about the axle coupled thereto; a plurality of slots disposed around the central socket, each of the plurality of axles translatable in one of the plurality of slots; and a plurality of biasing elements, each of the plurality of biasing elements engaging the body and engaging one of the plurality of arms, biasing the plurality of arms towards the open position.

In Example 3, the subject matter of Example 2 optionally includes wherein: the plurality of arms are arranged in a square configuration around the central socket.

In Example 4, the subject matter of Example 3 optionally includes a plurality of retention plates secured to the body, each of the plurality of retention plates engageable with one of the plurality of arms to restrict the plurality of arms from moving beyond the open position.

In Example 5, the subject matter of any one or more of Examples 3-4 optionally include each of the plurality of arms further comprising: a distal portion comprising a notch engageable with the microelectronic device when the microelectronic device is received by the central socket and when the plurality of arms are in the closed position.

In Example 6, the subject matter of Example 5 optionally includes the body further comprising: a plurality of stops, each stop engageable with one of the plurality of arms when the plurality of arms are in the closed position to restrict movement of each of the plurality of arms past the closed position.

In Example 7, the subject matter of any one or more of Examples 5-6 optionally include each of the plurality of arms further comprising: a chamfer disposed on an inner portion of each of the plurality of arms, each chamfer configured to guide a microelectronic device into the central socket when the plurality of arms are in the open position.

In Example 8a, the subject matter of any one or more of Examples 1-7 optionally include wherein: the plurality of arms form an access angle of about eighty degrees when the plurality of arms are in the closed position.

In Example 8, the subject matter of any one or more of Examples 1-7 optionally include wherein: the plurality of arms form an access angle configured to allow electromagnetic communication and physical access to the microelectronic device when the plurality of arms are in the closed position.

Example 9 is a socket assembly for a microelectronic device comprising: a body comprising a central socket configured to receive a microelectronic device therein; an arm adjacent to the central socket, the arm including an alignment guide portion and a retention portion, the arm switchable between the alignment guide portion and the retention portion in a single actuation.

In Example 10, the subject matter of Example 9 optionally includes the body further comprising: an axle coupled to the body and coupled to the arm such that the arm is rotatable about the axle; a slot disposed around the central socket, the axle translatable in the slot; and a biasing element engaging the body and engaging the arm, the biasing element biasing the arm to the alignment guide portion.

In Example 11, the subject matter of any one or more of Examples 9-10 optionally include the retention portion further comprising: a notch engageable with the microelectronic device when the microelectronic device is received by the central socket and when the arm is actuated to the retention portion.

In Example 12, the subject matter of any one or more of Examples 9-11 optionally include the alignment guide portion further comprising: a chamfer angled from the retention portion toward a proximal portion of each of the plurality of arms, the chamfer configured to guide a microelectronic device into the central socket when the arm is actuated to the alignment guide portion.

Example 13 is a system for testing a microelectronic device, the system comprising: a circuit board; a socket assembly secured to the circuit board, the socket assembly comprising: a body comprising a central socket configured to receive a microelectronic device therein; a plurality of arms each adjacent to the central socket, each of the plurality of arms rotatably coupled to the body and each of the plurality of arms translatable relative to the body to move between an open position and a closed position, the arms retaining a microelectronic device within the central socket when the arms are in the closed position.

In Example 14, the subject matter of Example 13 optionally includes a controller in communication with the circuit board and the linear actuator.

In Example 15, the subject matter of Example 14 optionally includes a selecting arm operable to place the microelectronic device in the central socket and remove the microelectronic device from the central socket.

In Example 16, the subject matter of Example 15 optionally includes wherein: the selecting arm is in communication with the controller and the controller operates the selecting arm.

In Example 17, the subject matter of any one or more of Examples 14-16 optionally include a wireless communication device connected to the controller and configured to wirelessly communicate with the microelectronic device.

In Example 18, the subject matter of any one or more of Examples 14-17 optionally include a plurality of linear actuators including the actuator, each of the plurality of linear actuators in communication with the controller, the controller configured to translate the plurality of linear actuators to move the arms between the open and closed positions.

In Example 19, the subject matter of any one or more of Examples 13-18 optionally include wherein: each of the plurality of arms form an access angle of about eighty degrees when the plurality of arms are in the closed position.

In Example 20, the subject matter of any one or more of Examples 13-19 optionally include a plurality of axles coupled to the body, each of the plurality of axles coupled to one of the plurality of arms such that each arm is rotatable about the axle coupled thereto; a plurality of slots disposed around the central socket, each of the plurality of axles translatable in one of the plurality of slots; and a plurality of biasing elements, each of the plurality of biasing elements engaging the body and engaging one of the plurality of arms, biasing the plurality of arms towards the open position.

Example 21 is a method of operating a microelectronic device testing system, the method comprising: inserting a microelectronic device into a central socket using an arm to guide the microelectronic device into the socket; and translating an axle supporting the arm in a closing direction causing the arm to impact a guide plate and causing rotation of the arm towards a closed position, the arm securing the microelectronic device within the socket in the closed position.

In Example 22, the subject matter of Example 21 optionally includes translating the axle supporting the arm in an opening direction, the translation causing rotation of the arm towards an open position, and removing the microelectronic device from the central socket.

In Example 23, the subject matter of Example 22 optionally includes forcing the microelectronic device into the central socket by engaging the microelectronic device with the arm as the arm moves toward the closed position.

In Example 24, the subject matter of Example 23 optionally includes sending an actuator control signal from a controller to a linear actuator to translate the axle between the opening and closing directions; and sending a wireless signal from a wireless transmitter to the microelectronic device while the arm is in the closed position and the microelectronic device is in the central socket.

In Example 25, the microelectronic devices, assemblies, or methods of any one of or any combination of Examples 1-24 is optionally configured such that all elements or options recited are available to use or select from.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A socket assembly for a microelectronic device comprising:
   a body comprising a central socket configured to receive a microelectronic device therein;
   a plurality of arms each adjacent to the central socket, each of the plurality of arms rotatably coupled to the body and each of the plurality of arms translatable relative to the body to move between an open position and a closed position, the arms retaining a microelectronic device within the central socket when the arms are in the closed position, the plurality of arms forming an access angle configured to allow electromagnetic communication and physical access to the microelectronic device when the plurality of arms are in the closed position.

2. The socket assembly of claim 1, the body further comprising:
   a plurality of axles coupled to the body, each of the plurality of axles coupled to one of the plurality of arms such that each arm is rotatable about the axle coupled thereto;
   a plurality of slots disposed around the central socket, each of the plurality of axles translatable in one of the plurality of slots; and
   a plurality of biasing elements, each of the plurality of biasing elements engaging the body and engaging one of the plurality of arms, biasing the plurality of arms towards the open position.

3. The socket assembly of claim 2, wherein:
   the plurality of arms are arranged in a square configuration around the central socket.

4. The socket assembly of claim 3, further comprising:
   a plurality of retention plates secured to the body, each of the plurality of retention plates engageable with one of the plurality of arms to restrict the plurality of arms from moving beyond the open position.

5. The socket assembly of claim 3, each of the plurality of arms further comprising:
   a distal portion comprising a notch engageable with the microelectronic device when the microelectronic device is received by the central socket and when the plurality of arms are in the closed position.

6. The socket assembly of claim 5, the body further comprising:
   a plurality of stops, each stop engageable with one of the plurality of arms when the plurality of arms are in the closed position to restrict movement of each of the plurality of arms past the closed position.

7. The socket assembly of claim 5, each of the plurality of arms further comprising:
   a chamfer disposed on an inner portion of each of the plurality of arms, each chamfer configured to guide a microelectronic device into the central socket when the plurality of arms are in the open position.

8. A socket assembly for a microelectronic device comprising:
   a body comprising a central socket configured to receive a microelectronic device therein;
   an arm adjacent to the central socket, the arm including an alignment guide portion and a retention portion, the arm switchable between an alignment guide position and a retention position in a single actuation, the arm including a chamfer angled from the retention portion toward a proximal portion of each of the plurality of arms, the chamfer configured to guide a microelectronic device into the central socket when the arm is actuated to the alignment guide position.

9. The socket assembly of claim 8, the body further comprising:
an axle coupled to the body and coupled to the arm such that the arm is rotatable about the axle;
a slot disposed around the central socket, the axle translatable in the slot; and
a biasing element engaging the body and engaging the arm, the biasing element biasing the arm to the alignment guide position.

10. The socket assembly of claim 8, the retention portion further comprising:
a notch engageable with the microelectronic device when the microelectronic device is received by the central socket and when the arm is actuated to the retention position.

11. A system for testing a microelectronic device, the system comprising:
a circuit board;
a socket assembly secured to the circuit board, the socket assembly comprising:
a body comprising a central socket configured to receive a microelectronic device therein;
a plurality of arms each adjacent to the central socket, each of the plurality of arms rotatably coupled to the body and each of the plurality of arms translatable relative to the body to move between an open position and a closed position, the arms retaining a microelectronic device within the central socket when the arms are in the closed position;
a linear actuator coupled to the arms, the linear actuator translatable to move the arms between the open and closed position;
a controller in communication with the circuit board and the linear actuator; and
a wireless communication device connected to the controller and configured to wirelessly communicate with the microelectronic device.

12. The system of claim 11, further comprising:
a selecting arm operable to place the microelectronic device in the central socket and remove the microelectronic device from the central socket.

13. The system of claim 12, wherein:
the selecting arm is in communication with the controller and the controller operates the selecting arm.

14. The system of claim 11, further comprising:
a plurality of linear actuators including the actuator, each of the plurality of linear actuators in communication with the controller, the controller configured to translate the plurality of linear actuators to move the arms between the open and closed positions.

15. The system of claim 11, wherein:
each of the plurality of arms form an access angle of about eighty degrees when the plurality of arms are in the closed position.

16. The system of claim 11, further comprising:
a plurality of axles coupled to the body, each of the plurality of axles coupled to one of the plurality of arms such that each arm is rotatable about the axle coupled thereto;
a plurality of slots disposed around the central socket, each of the plurality of axles translatable in one of the plurality of slots; and
a plurality of biasing elements, each of the plurality of biasing elements engaging the body and engaging one of the plurality of arms, biasing the plurality of arms towards the open position.

* * * * *